United States Patent [19]

Moser et al.

[11] Patent Number: 5,677,633
[45] Date of Patent: Oct. 14, 1997

[54] CABLE TEST INSTRUMENT HAVING INTERCHANGEABLE PERFORMANCE MODULES

[75] Inventors: John D. Moser, Mukilteo; Chuck C. Hanna-Myrick, Bellevue; Eric R. Drucker, Seattle, all of Wash.

[73] Assignee: Datacom Technologies, Inc., Everett, Wash.

[21] Appl. No.: 528,681

[22] Filed: Sep. 15, 1995

[51] Int. Cl.⁶ ........................................ G01R 27/26
[52] U.S. Cl. ................... 324/539; 324/540; 324/642
[58] Field of Search ............................ 324/533, 534, 324/539, 637, 642, 647, 540

[56] References Cited

U.S. PATENT DOCUMENTS

| | | | |
|---|---|---|---|
| 3,253,220 | 5/1966 | Hordosi | 324/540 |
| 3,636,439 | 1/1972 | Colligan . | |
| 3,800,218 | 3/1974 | Shekel | 324/642 |
| 4,013,949 | 3/1977 | Ice . | |
| 4,223,265 | 9/1980 | Simmen . | |
| 4,229,691 | 10/1980 | Loesch | 324/539 |
| 4,418,312 | 11/1983 | Figler et al. | 324/540 |
| 4,495,807 | 1/1985 | Field | 324/647 |
| 4,850,042 | 7/1989 | Petronio et al. . | |
| 4,931,791 | 6/1990 | Mallard, Jr. . | |
| 4,959,829 | 9/1990 | Griesing . | |
| 4,962,359 | 10/1990 | Dunsmore | 324/642 |
| 4,970,466 | 11/1990 | Bolles et al. . | |
| 5,057,783 | 10/1991 | Gubisch | 324/533 |
| 5,083,086 | 1/1992 | Steiner | 234/533 |
| 5,115,199 | 5/1992 | Yamagishi . | |
| 5,169,346 | 12/1992 | Johnston | 439/676 |
| 5,228,072 | 7/1993 | Ingalsbe et al. | 324/540 |
| 5,309,428 | 5/1994 | Copley et al. . | |
| 5,365,513 | 11/1994 | Copley et al. . | |
| 5,389,882 | 2/1995 | I'Anson et al. . | |
| 5,389,900 | 2/1995 | Georger | 333/25 |

Primary Examiner—Maura K. Regan
Attorney, Agent, or Firm—Christensen, O'Connor, Johnson & Kindness PLLC

[57] ABSTRACT

A test instrument (50) for testing a cable (52), the test instrument having a main unit (54) and an interchangeable performance module (56). The main unit of the test instrument contains signal generators for generating AC and DC test signals. The AC test signals are generated as single-ended signals and applied to a pair selection switching array (76). The pair selection switching array switches the single-ended test signals to a plurality of lines (84a–84d) that couple to the performance module. The performance module is an interchangeable module having a plurality of balancing networks (baluns) (102a–102d) that are connected to the plurality of lines. Single-ended test signals applied to the baluns are converted into balanced signals and applied to a cable being tested. The performance module may be interchanged to allow the main unit to be connected to cables having various impedances and connectors. The conversion to a balanced signal after the switching array improves the test instrument accuracy and allows the switching array to be constructed of transistors.

20 Claims, 5 Drawing Sheets

CABLE TEST INSTRUMENT HAVING INTERCHANGEABLE PERFORMANCE MODULES

FIELD OF THE INVENTION

The invention relates generally to test instruments, and more specifically to test instruments for the testing of cable.

BACKGROUND OF THE INVENTION

After installation of a Local Area Network (LAN), but before connection of network devices, it is important to test the network to ensure it is correctly configured. In many applications, it is also important to certify the network to ensure that it meets the Electronic Industry Association/ Telecommunications Industry Association (EIA/TIA) link performance standards. To troubleshoot and certify a LAN, a number of companies have developed hand-held test instruments that allow network installers to quickly and accurately test the cables used to construct the LAN.

LANs are generally constructed of a twisted wire cable that contains a number of twisted wire pairs. Existing hand-held test instruments will run a battery of tests to evaluate the performance of, and connections of, each of the twisted wire pairs within the cable. Representative tests performed by the test instruments include: (1) near end crosstalk (NEXT), which measures the coupled signal between adjacent twisted wire pairs within a cable; (2) attenuation, which measures the reduction in the strength or amplitude of a signal as it travels over the length of a twisted wire pair in the cable; (3) length, which measures the length of the cable using time domain reflectometry; and (4) noise, which measures the coupling of unwanted signals onto the cable from adjacent noise sources. Each of these tests relies upon the application or measurement of a high frequency alternating current (AC) signal to test the wire pair. For purposes of this application, the above tests and any other test using an AC signal will fall within a class of tests identified as AC tests.

In addition to the AC tests, most hand-held test instruments are also capable of performing other tests on the twisted wire pairs. Two important tests measure the continuity and resistance of the wire pairs in the cable. The continuity test verifies the electrical connection of a wire from one end of a cable to the other. The resistance test checks to see if the resistance of a wire within the cable is much larger than the other wire resistances within the cable, a condition indicative of a poor connection. The resistance and continuity tests use a direct current (DC) signal to test the wire pairs. For purposes of this application, the above tests and any other test using a DC signal will fall within a class of tests identified as DC tests.

A block diagram of the hardware in a typical test instrument 20 is shown in FIG. 1. Test instrument 20 contains appropriate hardware for generating AC and DC tests under the direction of a microcontroller 21. An AC test function block 22 contains an AC signal source 24 that is capable of generating a single-ended test signal. The single-ended test signal is applied to a balanced network (balun) 26 that converts the single-ended signal into a balanced signal. The balun also matches the impedance between the test instrument and the LAN cable. The single-ended signal is typically generated on a line having a 50 ohm impedance, and the balanced signal is provided on a wire pair having a 100 ohm impedance. As will be discussed in further detail below, the 100 ohm impedance matches the impedance of the wire pairs within the LAN cable that is to be tested.

The particular wire pair within the cable that is being tested is selected by a pair selection switching array 32. The output from the balun is connected to the switching array, which is connected by a plurality of lines 34 to a connector 36. A typical twisted-pair cable contains four twisted wire pairs, identified on the connector by the labels "PAIR 1" through "PAIR 4". Connector 36 is sized to receive a complementary connector on the end of a cable being tested, and to connect each of the plurality of lines from the switching array with each twisted wire pair contained within the cable. By appropriately switching the pair selection switching array 32, a test signal generated by the test signal generator may therefore be applied to one of the four twisted wire pairs contained within the twisted-pair cable.

The AC test function block 22 also contains an AC receiver 28 for receiving signals from the cable being tested. For example, when testing crosstalk on a twisted-pair cable, a test signal is transmitted on a twisted wire pair and the induced signal on another twisted wire pair within the cable measured by the AC receiver. Appropriately switching the switching array 32 allows the signal to be received by the AC receiver 28 from one of the four twisted wire pairs contained within the twisted-pair cable. The test instrument 20 is therefore capable of testing each of the twisted wire pairs contained within the cable by switching to each pair and performing the battery of AC tests.

In addition to performing AC tests on the twisted wire pairs within the cable, test instrument 20 is also capable of performing DC tests. A DC test function block 30 is connected to pair selection switching array 32. A direct connection with the switching array is necessary because the DC tests cannot be applied through the balun 26. In a typical construction, balun 26 is a transformer that prevents the propagation of DC signals. The DC signals generated by the DC test function generator are therefore directly switched by the pair selection switching array 32 onto one of the four twisted wire pairs contained within the twisted-pair cable. In this manner each of the twisted wire pairs in a cable may be tested by switching to each pair and performing the battery of DC tests.

While the test instrument architecture shown in FIG. 1 has become widely accepted in the industry, the architecture limits the accuracy of the testing performed by the test instrument because of the placement of the balun 26 before the pair selection switching array. At least three limitations are inherent in the design. First, the conversion from a single-ended signal to a balanced signal prior to the pair selection switching array 32 has a tendency to contribute to inaccurate measurements of the crosstalk between the twisted wire pairs. As the test signals are being routed through the pair selection switching array 32, there is a tendency for signal coupling to occur between the wire pairs, especially at high frequencies. The crosstalk within the test instrument is therefore added to the crosstalk measured on the cable, introducing error into the measurement of the cable crosstalk.

Second, the measurement of crosstalk between the twisted wire pairs should be performed with a perfectly balanced signal source and receiver. When a balanced signal is applied to a twisted wire pair, two components of the signal are carried on the wire pair. The first component is the difference between the voltage on one wire and the voltage on the other wire of the wire pair, referred to as the differential signal. The second component is a common voltage on both wires, referred to as the common mode signal. The ratio of the common mode signal to the differential signal generated by the test instrument is referred to as the output signal balance. By improving the output signal balance of the test instrument, the instrument can more accurately measure the crosstalk between the twisted wire pairs. Typically, a test signal is closely balanced when measured at the output of the balun 26. Passing the signal through the pair selection switching array 32, however, introduces an imbalance into the signals. The imbalance affects the performance of the test instrument by introducing error into crosstalk measurements taken by the instrument.

Finally, the third limitation of the hardware architecture represented in FIG. 1 is that placing the balun 26 prior to the pair selection switching array 32 limits the type of LAN cable to which the test instrument may be connected. When conducting tests of a cable, the output impedance of the test instrument should be closely matched with the input impedance of the cable in order to minimize reflections of the test signals at the connection boundary. Any reflections of the signals contribute to errors in measuring the cable performance. In the United States, most LANs are constructed with cable having a 100 ohm input impedance. Lines 34 should therefore have a 100 ohm impedance in order to match the impedance of the cable that is attached to the test instrument by the connector 36.

In the prior art test instruments, changing the impedance of the cable being tested therefore required changing the balun 26. For example, LANs in France typically are constructed with cables having a 120 ohm input impedance. Similarly, IBM has specified for certain LANs a 150 ohm input impedance. In order to match the test instrument of FIG. 1 with the input impedances to these different networks, the balun must be appropriately selected in order to ensure matching between the output impedance of the test instrument and the impedance of the cable to which the test instrument is connected. Because most baluns are fixed in the test instrument, prior art test instruments are limited to use with a single cable impedance due to the difficulty in adjusting or replacing the balun 26.

It will be appreciated that the hardware architecture of present test instruments limits the accuracy of the tests performed on a cable and also limits the type of LAN cable to which the test instrument may be connected. It would therefore be advantageous to develop a test instrument that was more accurate than present day instruments in order to improve the testing of LAN cables. It would also be advantageous to allow the balun 26 to be easily replaceable so that the test instrument may be connected to LANs having cables of varying impedances. The present invention is directed to a test instrument architecture that overcomes or minimizes the above-mentioned disadvantages.

SUMMARY OF THE INVENTION

The present invention is directed to a test instrument hardware architecture that improves the accuracy of AC tests performed on a LAN cable, and also allows connection of the test instrument to a variety of LAN cables having different input impedances while ensuring impedance matching between the test instrument and the cable. To accomplish these two objectives, in a preferred embodiment of the invention the test instrument hardware is separated into a main unit and a performance module. The main unit of the test instrument contains signal generators for generating AC and DC test signals. The AC test signals are generated as single-ended signals and directly applied to a pair selection switching array. The pair selection switching array is used to switch the single-ended test signals to an appropriate signal path leading to an external connector.

Coupled to the main unit at the external connector is the performance module. The performance module is an interchangeable module having a compatible connector for attachment to the main unit and a cable connector for attachment to a cable being tested. The performance module contains a plurality of baluns that are connected between the pair selection switching array in the main unit and each of the twisted wire pairs within the cable being tested. By appropriately switching the pair selection switching array, the single-ended test signal generated by the main unit may therefore be applied to one of the plurality of baluns. The single-ended test signal is converted into a balanced signal by the balun, and directly applied to one of the twisted wire pairs within the cable being tested. The conversion of the test signal from a single-ended signal to a balanced signal therefore occurs within the performance module, rather than within the main unit of the test instrument.

In accordance with one aspect of the invention, the baluns are located after the pair selection switching array rather than before the pair selection switching array in the test instrument. It will be appreciated that several advantages arise from placing the baluns after the pair selection switching array. Because the test signal is converted to a balanced signal immediately prior to application to a twisted wire pair, the output balance of the test signal is improved. Maintaining the balance of the test signal reduces the mount of common mode signal applied to the twisted wire pair, and improves the measurement of the crosstalk in the cable. Placing the baluns in close proximity to the cable connector also reduces the mount of crosstalk that is introduced by the test instrument. By switching the test signal on a line having a 50 ohm impedance, the mount of high frequency crosstalk that is introduced between each signal path in the pair selection switching array is minimized. The placement of the baluns immediately prior to the cable connector therefore improves the overall accuracy of the cable testing, and in particular, improves the measurement of the crosstalk between different wire pairs in the cable.

In accordance with another aspect of the invention, the baluns in the performance module may be varied so that the main unit may be connected to LAN cables having different impedances. The baluns contained within each performance module can be selected to ensure that the output impedance from the performance module is matched with the input impedance of the LAN cable. A network installer may therefore merely replace a performance module when working with different LANs, rather than having to use different test instruments for each type of LAN cable.

In accordance with yet another aspect of the invention, the cable connector in the performance module may be varied so that the main unit can be connected to a variety of different LAN cables. Potential cable connectors include RJ45 jack connectors, coaxial connectors, or fiber optic connectors. A network installer may therefore replace the performance module when working with different types of LAN cable.

In accordance with still another aspect of the invention, the pair selection switching array may be constructed of an array of transistors. The movement of the baluns to a location between the pair selection switching array and the cable connector provides a sufficient amount of static and voltage protection to ensure that the transistors are not damaged due to voltage spikes on the LAN during testing. In a preferred embodiment of the invention, the transistor array may be constructed of Gallium-Arsenide Field-Effect Transistors (GaAs FETs). The use of GaAs FETs improves the switching of the test signal by minimizing the crosstalk introduced by the switching array and speeding the switching time.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
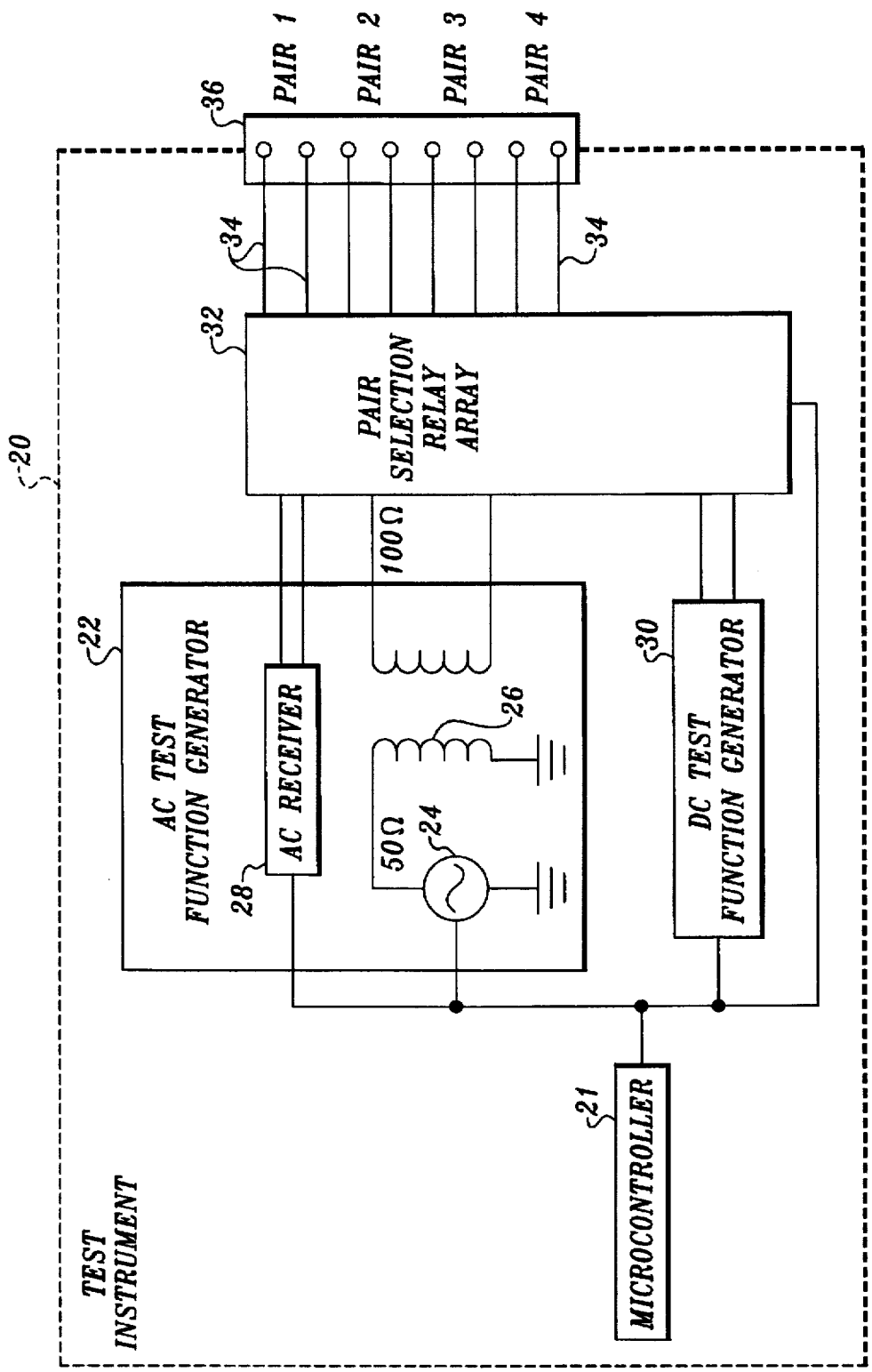
FIG. 1 is a hardware block diagram of a representative prior art test instrument for testing twisted wire pairs contained within a cable.
Figure 2:
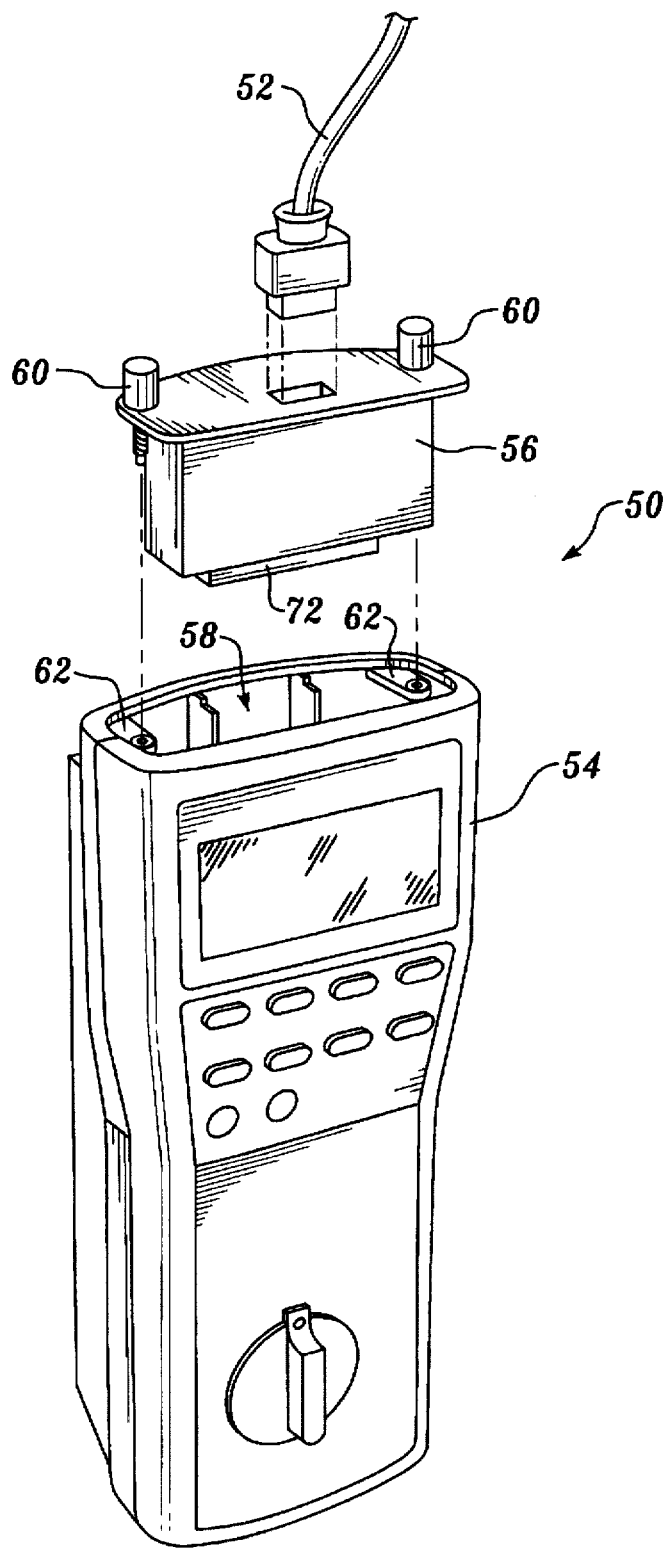
FIG. 2 is a perspective view of a test instrument formed in accordance with the present invention and having a main unit and interchangeable performance module.

As shown in FIG. 2, in accordance with the present invention a test instrument 50 is provided for performing AC and DC tests in order to test, troubleshoot, and certify twisted wire pairs contained within a cable 52. In a preferred embodiment of the test instrument, the instrument is divided into a main unit 54 and a performance module 56. The main unit 54 contains the hardware necessary to generate single-ended AC test signals and switch the test signals between a plurality of lines for transmission to the performance module. The performance module is coupled to the main unit by sliding the performance module into a complementary socket 58 in the main unit. Knobs 60 having threaded ends are provided on the performance module to engage threaded holes 62 and tightly fasten the performance module to the main unit. In a preferred embodiment, the electrical connection between the main unit and the performance module is automatically completed upon installation of the performance module. The connection allows the performance module 56 to receive AC test signals from the main unit. The performance module converts the AC test signals to balanced test signals, and applies the signals to the twisted wire pairs. The main unit and the performance module can also apply and receive DC test signals to the twisted wire pairs within the cable being tested. In a preferred embodiment of the invention, the performance module is interchangeable to allow the main unit to be coupled to cables having different impedances and different types of connectors.

Figure 3:
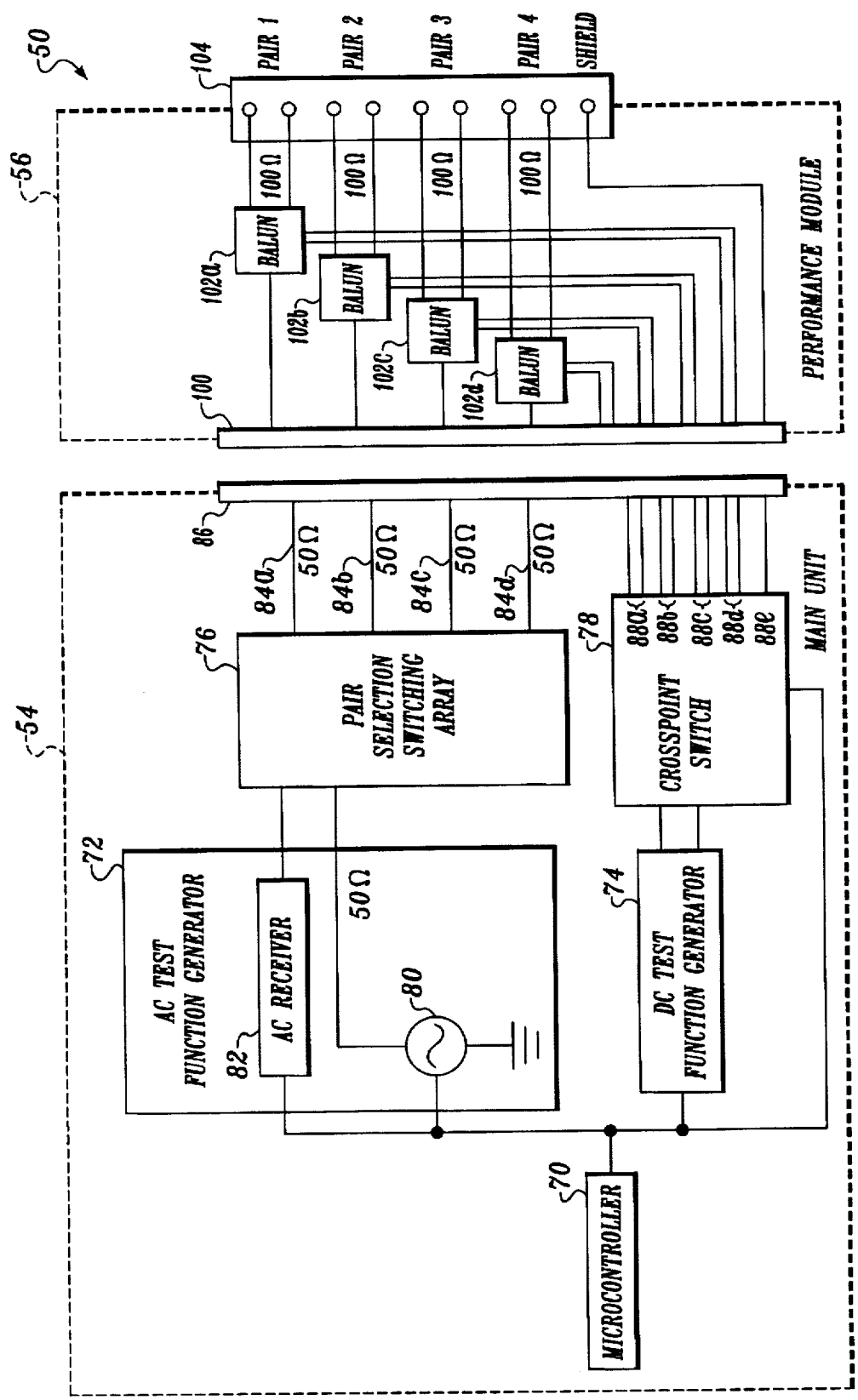
FIG. 3 is a hardware block diagram of the test instrument formed in accordance with the present invention, the test instrument having a pair selection switching array within the main unit and four baluns within the performance module for connection to four twisted wire pairs within a cable.

FIG. 3 is a block diagram of the hardware contained within test instrument 50. A microcontroller 70 is connected to an AC test function generator 72, a DC test function generator 74, a pair selection switching array 76, and a crosspoint switch 78. The microcontroller is responsible for the application and analysis of the AC and DC tests being performed on a cable connected to the test instrument. The AC test function generator includes an AC signal generator 80 for generating a single-ended test signal on a line having an impedance of 50 ohms. The AC signal generator is connected to the pair selection switching array 76, an array of switches that will be discussed in additional detail below. The pair selection switching array allows the test signal to be switched between a plurality of lines 84a–84d that lead to a connector 86. The AC test function generator also includes an AC receiver 82 that is connected to the pair selection switching array. The pair selection switching array may be switched to allow a signal to be received by the AC receiver from one of the plurality of lines 84a–84d. The main unit hardware architecture thus allows single-ended test signals to be selectively applied or received on a plurality of lines.

The DC test function generator 74 contained within the main unit is connected to the crosspoint switch 78. The crosspoint switch allows DC test signals generated by the DC test function generator to be switched between a plurality of line pairs 88a–88d. Line pairs 88a–88d connect the crosspoint switch with the connector 86. The crosspoint switch may be switched to allow a signal to be received by the DC test function generator from one of the plurality of line pairs 88a–88d. A line 88e may also switched by the crosspoint switch. Line 88e is connected within the performance module to the shield of the cable being tested. The main unit hardware architecture thus allows DC test signals to be selectively applied or received on a plurality of line pairs.

In a preferred embodiment of the test instrument, the pair selection switching array and the crosspoint switch allow the AC and DC test signals to be switched to one of four lines or line pairs. Those skilled in the art will appreciate, however, that the number of lines can be increased or decreased by appropriate expansion or contraction of the pair selection switching array and crosspoint switch. It will also be appreciated that the hardware necessary to generate the AC and DC tests in the main unit is well known to those skilled in the art.

Connector 86 mates with a corresponding connector 100 contained on the performance module 56 to provide an electrical connection between the main unit and the performance module. The performance module 56 contains four balancing networks (baluns) 102a–102d, each balun connected between a line from the main unit and one of a plurality of twisted wire pairs in the cable to be tested. As shown in FIG. 3, a single-ended input to each balun is connected to a respective line 84a–84d through connectors 86 and 100, and a pair of inputs to each balun is connected to a respective line pair 88a–88d through connectors 86 and 100. A balanced output from each balun is connected to a cable connector 104. Cable connector 104 electrically couples the performance module to a plurality of twisted wire pairs contained within a cable connected to the performance module. Each pair is identified on the cable connector by the labels "PAIR 1" through "PAIR 4." A detailed discussion of the balun construction will be provided below with respect to FIG. 4. Prior to discussing the construction of the balun, however, the operation of the performance module will be reviewed.

The baluns 102a–102d have two modes of operation. In a first mode of operation, AC test signals may be transmitted and received from the test instrument. A single-ended AC test signal on one of the lines 84a–84d is converted into a balanced test signal and applied to a selected twisted wire pair through cable connector 104. A balanced AC test signal measured on one of the twisted wire pairs is converted into a single-ended signal and provided to the main unit on one of the lines 84a–84d. Applying the AC test signal and detecting any received signals allows the main unit to perform AC testing of the cable, including measuring the cable crosstalk.

In a second mode of operation, a DC test signal is received on line pairs 88a–88d and applied to a selected twisted wire pair through cable connector 104. A DC signal measured on one of the twisted wire pairs is provided to the main unit on one of the line pairs 88a–88d. Applying and measuring the DC test signal allows the main unit to perform DC testing of the cable, including measuring the resistance of the wires within the cable. The hardware architecture allowing these two modes of operation is shown in the schematic of FIG. 4.

Figure 4:
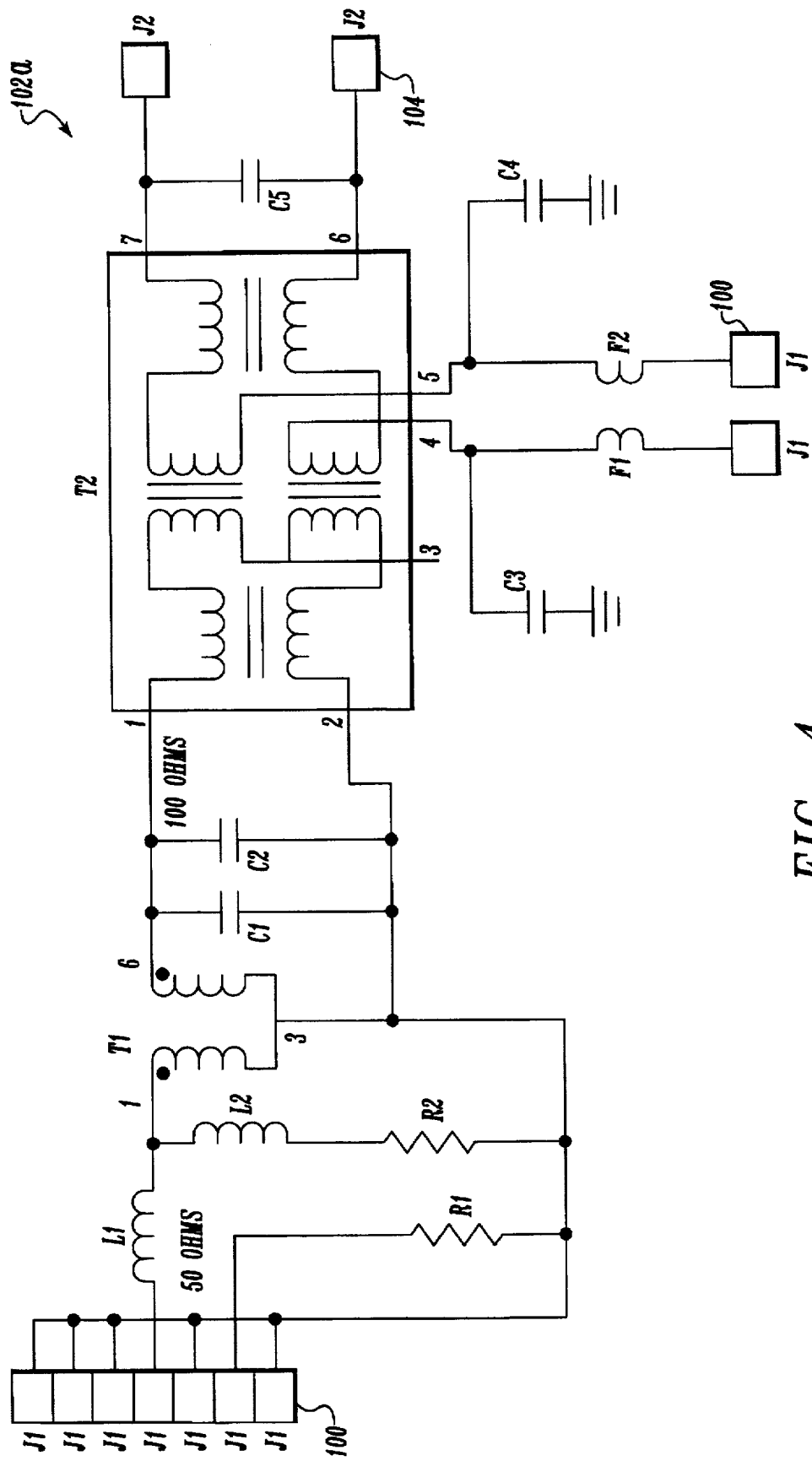
FIG. 4 is a schematic diagram of one of the four baluns in the performance module.

FIG. 4 is a schematic of the balun 102a within the performance module. It will be appreciated that the other baluns 102b–102d within the performance module are constructed similarly to balun 102a. Two signal paths are present from connector 100 to cable connector 104, each corresponding to one of the modes of operation of the balun. The first signal path, corresponding to the signal path used during AC testing of a cable, extends between the left and right edges of FIG. 4. An inductor L1 is coupled between connector 100 and the dotted input terminal of the primary winding of a transformer T1. The undotted end of the primary winding of transformer T1 is coupled via connector 100 to ground. Also connected between the dotted terminal of transformer T1 and ground is an inductor L2 in series with a resistor R2. The dotted end of the secondary winding of transformer T1 is connected to a primary winding of a transformer T2. The undotted terminal of the secondary winding of transformer T1 is connected to ground. Connected in parallel between the dotted terminal of transformer T1 and ground are capacitors C1 and C2. The secondary winding of transformer T2 is connected across a capacitor C5 to cable connector 104. Transformer T2 is a custom transformer having a split center tap, a preferred embodiment of which is manufactured by Pulse Engineering of San Diego, Calif. One lead of the split center tap of transformer T2 is connected via a capacitor C3 to ground, and the other lead of the split center tap is connected by a capacitor C4 to ground.

When AC testing is being performed, a single-ended AC test signal on a 50 ohm line is applied across the primary winding of transformer T1. Transformer T1 matches the signal to a line having a 100 ohm impedance for application to the primary winding of transformer T2. Transformer T2 converts the single-ended signal to a balanced signal. During the conversion of the high frequency signal, capacitors C3 and C4 on the split center tap of transformer T2 act as shorts to ground. The balanced AC test signal is then applied to a twisted wire pair through cable connector 104. To prevent the AC test signal from being coupled back to the main unit, coils F1 and F2 are provided between connector 100 and the split center tap of the secondary winding of transformer T2.

The balun 102a must also operate in reverse, in order to pass signals received from a twisted wire pair through connector 100 to the AC receiver contained in the main unit. In the reverse path, a balanced signal received on a twisted wire pair is converted by transformer T2 into a single-ended signal, before being matched by transformer T1 to the 50 ohm line leading to the main unit. As shown in the schematic of FIG. 4, inductor L1, and capacitors C1, C2, and C5 have been added to the balun design to improve the return signal loss. That is, inductor L1, and capacitors C1, C2 and C5 ensure that the return signal loss as measured by a signal input to the balun from connector 104 meets the appropriate EIA/TIA TSB-67 Level II requirements.

In a preferred embodiment of the test instrument, the main unit is also capable of measuring the length of the attached cable by transmitting a pulse on the cable and measuring the time it takes for a reflection of the pulse to return to the main unit. To compensate for the flattening of the low frequency pulse response during the time domain reflectometry testing, resistor R2 and inductor L2 have been added across the primary winding of transformer T1.

Those skilled in the art will appreciate that the values of the components in the balun 102a may be varied depending on the bandwidth of the signals used by the main unit in the AC testing. Moreover, other components may be added or removed to precisely tune the frequency response of the balun for specific tests. Although individual pins of connector 100 and cable connector 104 are shown in FIG. 4, the types of connectors and the pin connections may also be varied to suit the particular application.

The second signal path within the balun, corresponding to the DC signal path used during DC testing, extends between the bottom and the right edge of FIG. 4. Coils F1 and F2 are coupled between connector 100 and the split center taps of the secondary winding of transformer T2. A DC signal applied across the split center tap will therefore be directly applied on the lines to cable connector 104. The DC test signal does not propagate through the rest of the balun because transformer T2 prevents the DC signal from being applied to transformer T1. The balun also operates in reverse, allowing a DC signal received on a twisted wire pair to be conducted to the DC test function generator on the main unit of the test instrument.

With reference to FIGS. 3 and 4, it will be appreciated that the performance module can be changed to allow the test instrument to be connected to cables having different impedances. To change the output impedance of the test instrument, transformer T1 may be varied within different performance modules. For example, in one performance module, transformer T1 may be replaced with a transformer that matches the 50 ohm test instrument impedance with a 120 ohm cable impedance. In another performance module, transformer T1 may be replaced with a transformer that matches the 50 ohm test instrument impedance with a 150 ohm cable impedance. Using the test instrument to test various cables would therefore require switching to the appropriate version of performance module.

In a preferred embodiment of the invention, the main unit can automatically detect the version of performance module that is installed in the main unit, and appropriately adjust the generated test signals to optimize the operation of the main unit with the selected performance module. The main unit identifies the performance using a four digit binary code that is pre-assigned to each performance module version. As shown in FIG. 4, a resistor R1 may be included between connector 100 and ground in each balun 102a–102d. The presence or absence of a resistor in the balun signifies to the main unit a logic "1" or a logic "0". The main unit may therefore identify which performance module is present by reading the four digit binary value corresponding to the presence or the absence of resistor R1 in each balun. In this manner, up to sixteen different versions of performance module may be specified, each having different impedance values or difference types of cable connectors.

Several advantages arise from locating the baluns after the pair selection switching array in the test instrument. Because the test signal is converted to a balanced signal immediately prior to application of the signal to a twisted wire pair, the output balance of the signal is improved, and less error in the crosstalk measurement is introduced by the test instrument. Locating the baluns between the cable connector and the pair selection switching array also provides static and voltage protection to the pair selection switching array. In a preferred embodiment of the invention, sufficient protection is provided to allow the pair selection switching array 76 to be constructed of an array of Gallium-Arsenide Field-Effect Transistors (GaAsFETs).

Figure 5:
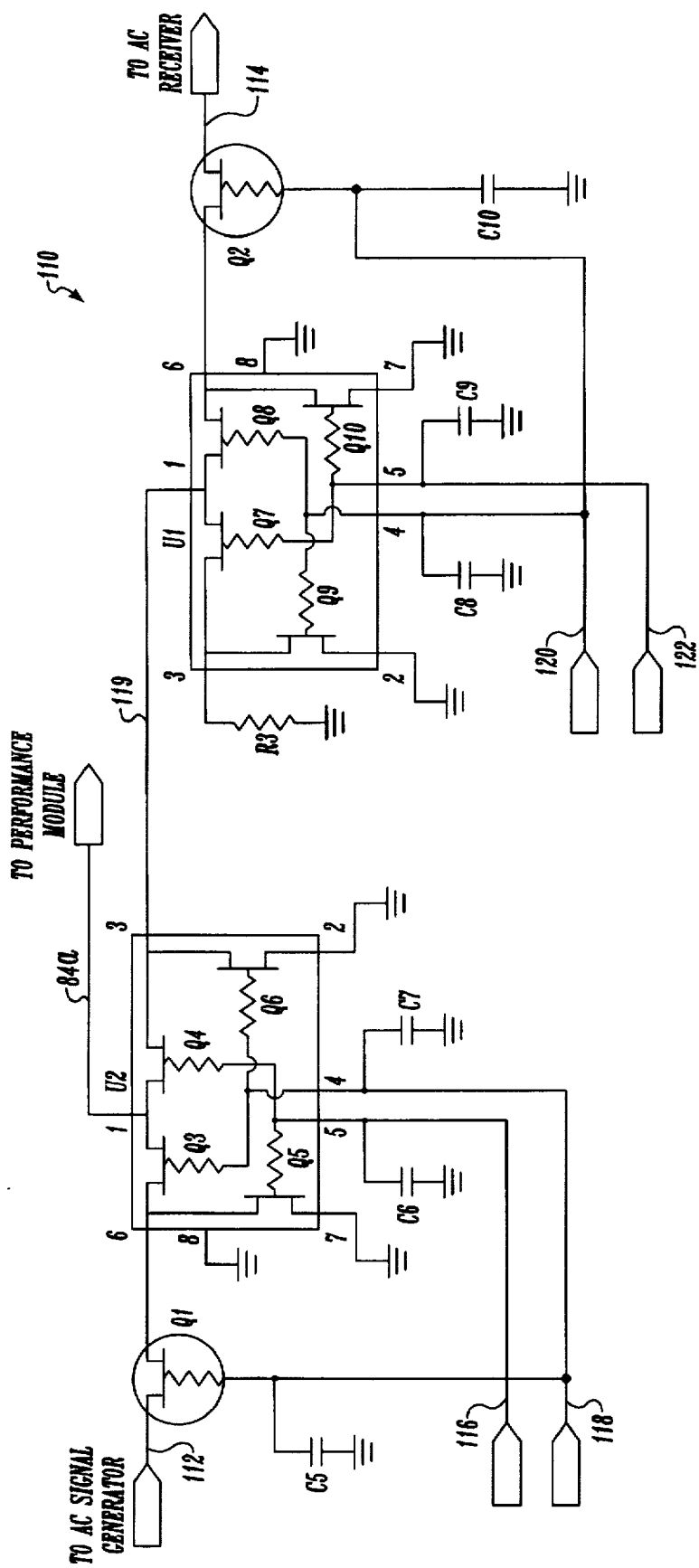
FIG. 5 is a schematic diagram of one channel of the pair selection switching array in the main unit.

With reference to FIG. 3, the pair selection switching array 76 switches the test signal from the AC signal generator 72 to the plurality of lines 84a–84d leading to the baluns 102a–102d on the performance module, and also switches received signals from the baluns to the AC receiver 80. To perform the switching, the switching array contains a plurality of channels, each corresponding to one of the lines 84a–84d from the array. FIG. 5 is a schematic of one channel 110 of the pair selection switching array corresponding to line 84a. It will be appreciated that the other channels within the switching array are constructed in a similar manner.

Channel 110 allows a signal to be routed between the AC signal generator, the performance module, the AC receiver, and a 50 ohm termination. The AC signal generator is coupled to the channel by a line 112. The drain of a transistor Q1 is connected to line 112, and the source of transistor Q1 is coupled to a transistor switch U2. The gate of transistor Q1 is connected to a control line 118, allowing the transistor to be biased "on" or "off" by appropriate application of a control signal to the control line. Transistor switch U2 contains four transistors Q3, Q4, Q5, and Q6, that may be selectively biased on or off by application of control signals on control lines 116 and 118. The drain of transistor Q3 is connected to the source of transistor Q1. The source of transistor Q3 is connected to the performance module via line 84a and to the drain of transistor Q4. The source of transistor Q4 is connected by a line 119 to a second transistor switch U1. Shunt transistors Q5 and Q6 allow the drain of transistor Q3 and the source of transistor Q6 to be shunted to ground, respectively.

Transistor switch U1 also contains four transistors Q7, Q8, Q9, and Q10, that may be selectively biased on or off by application of control signals on control lines 120 and 122. The drain of transistor Q7 and the source of transistor Q8 are connected to line 119. The source of transistor Q7 is connected to ground through a resistor R3. Shunt transistors Q9 and Q10 allow the source of transistor Q7 and the drain of transistor Q8 to be shunted to ground, respectively. The drain of transistor Q8 is connected to a source of transistor Q2. The drain of transistor Q2 is coupled by a line 114 to the AC receiver in the main unit. The gate of transistor Q2 is connected to a control line 120, allowing the transistor to be biased on or off by appropriate application of a control signal to the transistor's gate. It will be appreciated that capacitors C5–C10 are provided between each of the control lines and ground to filter noise that may be present on the control lines.

In a preferred embodiment of the invention, transistors Q1–Q10 are GaAs FET transistors. GaAs FETs are biased "on" when 0 volts is applied to the gate, and biased "off" when approximately −5 volts are applied to the gate. The circuitry necessary to generate and apply the control signals to the transistor gates is well known to those skilled in the art. Through the appropriate selection and application of control signals on the control lines, it is possible to switch between transmitting and receiving signals on a given channel. In particular, each channel in the switching array may operate in one of three modes.

In a first mode of operation, a test signal generated by the AC signal generator may be switched to a selected line leading to the performance module. To transmit a signal on a particular channel, a 0 volt control signal is applied on control line 118 to bias transistors Q1, Q3, and Q6 on. Simultaneously, transistors Q4 and Q5 are biased off by application of −5 volts on control line 116. Biasing the transistors in this manner allows an AC test signal present on line 112 to be switched through transistors Q1 and Q3 to the performance module on line 84a. A path is thus created between the AC signal generator in the main unit and a selected twisted wire pair. At the same time, to prevent the test signal from being applied to the AC receiver, transistors Q2, Q8, and Q9 are biased off.

In a second mode of operation, a test signal received on a wire pair may be switched from line 84a to line 114 leading to the AC receiver. To receive a signal on a particular channel, transistors Q4 and Q5 are biased on, and transistor Q1, Q3, and Q6 are biased off, switching the received signal from line 84a to line 119. Simultaneously, transistors Q8, Q9, and Q2 are biased on and transistors Q7 and Q10 are biased off, switching the signal from line 119 to line 114. A path is thereby created on a particular channel between a selected twisted wire pair and the AC receiver in the main unit.

In a third mode of operation, a selected wire pair may be terminated by a 50 ohm resistance. To terminate a wire pair, transistors Q4 and Q5 are biased on, and transistor Q1, Q3, and Q6 are biased off, coupling line 84a with line 119. Simultaneously, transistors Q7 and Q10 are biased on and transistors Q8, Q9, and Q2 are biased off, creating a path from line 119 through resistor R3 to ground. In a preferred embodiment, resistor R3 has a value of 44.2 ohms. The combination of R3 with the series resistances of transistors Q4 and Q7 therefore terminates line 84a with approximately 50 ohms.

The use of transistors in the pair selection switching array improves the switching of signals within the main unit by minimizing the crosstalk introduced by the switching array and reducing the switching time. Those skilled in the art will recognize that the channel 110 shown in FIG. 5 is a representative design using GaAs FET transistors to switch signals. The use of baluns to isolate the switching array from the twisted wire pairs allows the switching array to be constructed of other types of transistors, and using other switching array designs.

While the preferred embodiment of the invention has been illustrated and described, it will be appreciated that various changes can be made therein without departing from the spirit and scope of the invention. Those skilled in the art will appreciate that while the preferred embodiment of the invention contains a detachable performance module, in a second embodiment of the invention the hardware in the performance module may be integrally included in the main unit. In the second embodiment, the ability to switch performance modules and change the test instrument for various impedances and cables would be lost. The improved accuracy in the cable testing due to the placement of the baluns after the pair selection switching array would, however, be retained.

Those skilled in the art will also recognize that while the preferred embodiment of the test instrument is designed to test cables in a LAN, the test instrument may also be adapted for cable testing in other environments. For example, although the preferred embodiment of the invention produces a balanced test signal for application to a twisted-pair cable, it is also possible to ground one end of the pair of output lines. Grounding one of the output lines would allow the test instrument to test single-conductor cables using a single-ended signal.

Those skilled in the art will further recognize that while the preferred embodiment of the test instrument allows testing of four twisted wire pairs, the number of twisted wire pairs that may be tested can be increased or decreased. At the simplest level, the performance module can be configured to allow the testing of only a single twisted wire pair. Alternatively, the pair selection switching array can be expanded to allow more than four twisted wire pairs to be tested in a single cable. Consequently, within the scope of the appended claims it will be appreciated that the invention can be practiced otherwise than as specifically described herein.

The embodiments of the invention in which an exclusive property or privilege is claimed are defined as follows:

1. A test instrument for testing a cable having a wire pair, said test instrument comprising:
   (a) a signal generator for generating a single-ended test signal to test the cable;
   (b) a receiver for measuring a single-ended received signal from the cable;
   (c) a switch coupled to the signal generator and the receiver and switchable between a first state and a second state; and
   (d) a performance module comprising:
      (i) a balun coupled to the switch, the balun receiving a single-ended test signal and converting the single-ended test signal into a balanced test signal to be applied to the cable when the switch is in the first state, the balun receiving a balanced received signal from the cable and converting the balanced received signal into a single-ended received signal to be applied to the receiver when the switch is in the second state; and
      (ii) a cable connector coupling the balun to the cable.

2. The test instrument of claim 1, wherein the performance module further comprises a plurality of baluns.

3. The test instrument of claim 2, further comprising a switching array coupled to the signal generator, the receiver, and the plurality of baluns, the switching array allowing the single-ended test signal to be switched to one of the plurality of baluns, and allowing the single-ended received signal to be switched from one of the plurality of baluns.

4. The test instrument of claim 3, wherein the switching array is comprised of a plurality of transistors.

5. The test instrument of claim 4, wherein the plurality of transistors are Gallium-Arsenide Field-Effect Transistors (GaAs FETs).

6. The test instrument of claim 2, wherein each of the baluns comprises a transformer.

7. The test instrument of claim 6, wherein the transformer contains a split center tap that is coupled to the signal generator.

8. The test instrument of claim 2, wherein the performance module further comprises a plurality of connectors for coupling the plurality of baluns to a twisted-pair cable.

9. The test instrument of claim 1, wherein the performance module may be mechanically and electrically coupled to and decoupled from the switch.

10. A test instrument for testing a plurality of wire pairs, the test instrument comprising:
    (a) a signal generator for generating a single-ended test signal;
    (b) a receiver for measuring a single-ended received signal;
    (c) a pair selection switching array coupled to the signal generator and the receiver, the pair selection switching array allowing the single-ended test signal to be switched to one of a plurality of lines in a first state, and allowing a single-ended received signal to be switched from one of the plurality of lines in a second state;
    (d) a plurality of baluns coupled to the plurality of lines, one of the plurality of baluns receiving the single-ended test signal and converting the single-ended test signal into a balanced test signal when the pair selection switching array is in the first state, one of the plurality of baluns receiving a balanced received signal and converting the balanced received signal into a single-ended received signal when the pair selection switching array is in the second state; and
    (e) a connector coupled to the plurality of baluns, the connector coupling the plurality of baluns with the plurality of twisted wire pairs.

11. The test instrument of claim 10, wherein the pair selection switching array is comprised of a plurality of transistors.

12. The test instrument of claim 11, wherein each of the plurality of transistors is a GaAs FET.

13. The test instrument of claim 10, wherein the plurality of baluns and the connector are provided in a module that may be detached from the test instrument.

14. The test instrument of claim 10, wherein each of the plurality of baluns comprises a transformer.

15. The test instrument of claim 14, wherein the transformer has a split center tap that is coupleable to the signal generator.

16. An instrument for testing a cable having a plurality of wires, the instrument comprising:
    (a) a signal generator for generating a single-ended test signal;
    (b) a receiver for measuring a single-ended received signal;
    (c) a switching array coupled to the signal generator and the receiver, the switching array allowing the single-ended test signal to be switched to one of a plurality of lines in a first state, and allowing a single-ended received signal to be switched from one of a plurality of lines in a second state; and
    (d) a performance module that may be electrically coupled to or decoupled from the switching array, the performance module comprising:
       (i) a plurality of baluns that are couplable to the plurality of lines, each of the plurality of baluns for converting the single-ended test signal into a balanced test signal when the switching array is in the first state and for converting a balanced received signal to a single-ended received signal when the switching array is in the second state; and
       (ii) a connector coupled to the plurality of baluns for coupling the plurality of baluns to the plurality of wires in said cable.

17. The instrument of claim 16, wherein the switching array comprises a plurality of transistors.

18. The instrument of claim 17, wherein the plurality of transistors are GaAs FETs.

19. The instrument of claim 16, wherein each of the plurality of baluns comprises a transformer.

20. The instrument of claim 19, wherein the transformer has a split center tap that is coupleable to the signal generator.

* * * * *